United States Patent [19]

Wong

[11] Patent Number: 5,210,447
[45] Date of Patent: May 11, 1993

[54] WORD DECODER WITH SBD-$T_x$ CLAMP

[75] Inventor: Robert C. Wong, Poughkeepsie, N.Y.

[73] Assignee: International Business Machines Corporation, Armonk, N.Y.

[21] Appl. No.: 784,832

[22] Filed: Oct. 30, 1991

[51] Int. Cl.$^5$ .................. H03K 3/33; H03K 19/082
[52] U.S. Cl. .................. 307/463; 307/300; 307/549; 307/455
[58] Field of Search .............. 307/455, 463, 458, 443, 307/300, 280, 475, 549

[56] References Cited

U.S. PATENT DOCUMENTS

| | | | |
|---|---|---|---|
| 3,864,584 | 2/1975 | Hutson | 307/268 |
| 4,251,737 | 2/1981 | Gaudenzi | 307/280 |
| 4,394,588 | 7/1983 | Gaudenzi | 307/443 |
| 4,458,162 | 7/1984 | Solomon et al. | 307/200 |
| 4,494,017 | 1/1985 | Montegari | 307/463 |
| 4,521,699 | 6/1985 | Wilson | 307/300 |
| 4,841,173 | 6/1989 | Koyama | 307/458 |
| 4,920,286 | 4/1990 | Wise et al. | 307/549 |
| 5,022,010 | 6/1991 | Chan | 307/463 |

OTHER PUBLICATIONS

Canada, High Performance Word Decorder for HPNP Cells, Jul. 1989, IBM Technical Discolsure Bull. vol. 32, #2, pp. 272–274.
Walach, New Up Level Clamp for Push-Pull Off-Chip Drivers, IBM Technical Disclosure Bulletin, vol. 30 #7, p. 134, Dec. 1987.
Klein, Low Power Word Line Driver, IBM Technical Disclosure Bulletin, vol. 30, #6, 382–3, Sep. 1987.

Primary Examiner—Edward P. Westin
Assistant Examiner—Andrew Sanders
Attorney, Agent, or Firm—Charles W. Peterson, Jr.

[57] ABSTRACT

An anti-saturation clamp for a word decoder utilizes a Schottky Barrier Diode (SBD) $S_x$ in combination with a transistor $T_x$. The transistor $T_x$ is in circuit with a switching transistor T and diverts the majority of pull down current from the switching transistor. The saturation capacitance of the transistor T is negligible even at high temperature operation, and the transistor T does not operate in saturation. The SBD clamp $S_x$ is in circuit between transistors $T_x$ and T, and can be significantly smaller than a conventional SBD clamp since the clamp current is amplified by transistor $T_x$. The improved anti-saturation clamp eliminates delay otherwise resulting from saturation capacitance of the switching transistor and results in a performance gain of about 40% for nominal operations. Also contemplated by the invention are improved word decoder systems per se (those which incorporate the aforementioned anti-saturation clamp), and improved methods for enhancing the performance of word decoder systems to, for example, support advanced computing applications.

17 Claims, 4 Drawing Sheets

NEW WORD-LINE DECODER/DRIVER WITH SBD-TX CLAMP

WORD-LINE DECODER/DRIVER
(PRIOR ART)

ONE STAGE WORD-LINE DECODER/DRIVER

WORD DECODER WITH SBD-T$_x$ CLAMP

BACKGROUND OF THE INVENTION

1. Field of the Invention

The present invention is directed to an improved anti-saturation clamp for use with word decoders. The clamp is particularly useful in connection with Harper/PNP arrays in which large word line swings are required to guarantee array functionality at extreme conditions.

2. Description of the Related Art

In a known two-stage decoder system, commercially available as part of the IBM System 3090 ("IBM" is a registered trademark of the International Business Machines Corporation), the first stage is a regular ECL current switch to handle the initial swing. The second stage completes the word line pull up or drain line pull down by a saturation inversion device comprising a transistor. A resistor is employed as the pull up device to provide the drive for word line selection. When the word line is deselected at the down level, a large current must be pulled down from the resistor through the inversion transistor while the transistor is in saturation, resulting in high saturation capacitance and delay in the word line upswing.

Known anti-saturation clamps that may be used to alleviate these problem can be classified in three (3) different categories, namely: (1) clamps in which base current is diverted to the collector, such as commonly employed SBD clamps; (2) clamps providing brute force voltage bias at the collector node to prevent the collector node from falling into the saturation region, such as cavaliere clamps or other voltage pull up bias circuits; and (3) anti-saturation clamps which combine the two aforementioned devices.

The general state of the prior art with respect to solving the aforementioned high saturation capacitance and related problems may be best illustrated and understood with reference to the several publications and patents to be described immediately hereinafter.

IBM Technical Disclosure Bulletin, Vol. 32, No. 2, pages 272–274 (July, 1989), discloses a high performance word decoder for Harper/PNP cells including a clamping network providing a deselect level which tracks with the select level and the margin needed during write operation. In this system, the depicted LWL levels are clamped to a level that tracks with the Vcc voltage. However, the deselect is slow, many devices are needed for operation of the system, and high standby power is required because the pull down current is from Vcc.

IBM Technical Disclosure Bulletin, Vol. 30, No. 6, page 382–383 (November, 1987), discloses a low power word line driver. However, the system operates very slowly because it employs a PNP pull up.

U.S. Pat. No. 4,494,017, to Montegari, issued Jan. 15, 1985, discloses a decode circuit utilizing NPN and PNP transistors. This system operates very slowly because PNP transistors are employed in the decoder, even though one stage may be reduced. This reference also advocates against the use of any anti-saturation clamps by choosing parameters which will avoid saturation. (See Column 13, line 20–28).

IBM Technical Disclosure Bulletin, Vol. 22, No. 8B, pages 3736–3737 (January, 1980), discloses a two-stage decoder circuit which operates very slowly as a result of saturation operation and pulsing.

IBM Technical Disclosure Bulletin, Vol. 23, No. 9, pages 3747–3748 (January, 1982), discloses a high speed decoder circuit which is a variation of the two-stage decoder circuit (IBM Technical Disclosure Bulletin, Vol. 22, No. 8B, pages 3736–3737), discussed hereinabove. The modified circuit is employed for high density, low power arrays. However, the circuit performance is extremely low, i.e., not acceptable for present day advanced computing applications.

IBM Technical Disclosure Bulletin, Vol. 30, No. 7, page 134 (December, 1987), discloses an up-level clamp for push-pull off chip drivers.

IBM Technical Disclosure Bulletin, Vol. 20, No. 2, pages 562–563 (July, 1978), discloses one form of an array true-complement generator with power drive. This reference, like the aforementioned U.S. Pat. No. 4,494,017, to Montegari, advocates against the use of any anti-saturation clamps.

U.S. Pat. No. 4,394,588, to Gaudenzi, issued Jul. 19, 1983, discloses a circuit driver for limiting the di/dt down transition to minimize di/dt. The system is particularly directed to an off-chip driver for allowing switching of multiple drivers while limiting the di-dt current for down going transition.

U.S. Pat. No. 3,864,484, to Hutson, issued Feb. 4, 1975, discloses a driver circuit employing a PNP transistor which operates slowly. The output device base node levels are controlled with standard SBD (Schottky Barrier Diode) clamps.

None of the aforementioned references, which exemplify the state of the art, teach, claim or even suggest an anti-saturation clamp (or any other anti-saturation means), for use in connection with word decoder systems, which assures that a switching transistor will not operate in saturation to thereby improve system performance by eliminating the delay resulting from saturation capacitance.

Accordingly, it would be desirable to be able to provide a new and improved anti-saturation clamp which eliminates the aforementioned delay resulting from saturation capacitance.

Furthermore, it would be desirable to be able to provide improved word decoder systems that exhibit operating characteristics that are enhanced by virtue of including the improved anti-saturation clamp contemplated by the invention.

Still further, it would be desirable to provide improved methods for enhancing the performance of word decoder systems in general.

SUMMARY OF THE INVENTION

It is the primary object of the present invention to provide improved anti-saturation means for use in connection with word decoder systems. This object is achieved by employing a clamp consisting of an SBD-T$_x$ combination, discussed in detail hereinafter.

It is a further object of the invention to provide improved word decoder systems that exhibit operating characteristics that are enhanced by virtue of including the improved anti-saturation clamp contemplated by the invention.

Still further, it is an object of the invention to provide improved methods for enhancing the performance of word decoder systems in general.

The present invention provides an anti-saturation clamp for a word decoder system including a first transistor T which is operable in a saturated state. The clamp includes a second transistor $T_x$ coupled in circuit to the first transistor for conducting at least a portion of the base and collector current of the first transistor through the second transistor.

The transistor $T_x$ diverts a sufficient portion of the base and collector current from the primary switching transistor T, reducing the saturation capacitance of the switching transistor, and avoiding saturation thereof.

An SBD clamp $S_x$ is interposed in circuit between the transistors T and $T_x$. The anti-saturation clamp, including the $S_x-T_x$ combination, results in more efficient, faster, and higher performance gain in the switching operation since the switching transistor T does not operated in saturation with high currents. The clamp current is amplified by $T_x$, and $S_x$ can be significantly smaller than the conventional SBD clamp employed in prior art decoder systems. The anti-saturation clamp constitutes a part of the drain line down level control of the decoder system, serving also as an anti-saturation clamp for the drain line pull down transistors.

The transistor $T_x$ of the anti-saturation clamp may be coupled in circuit to one or more pull down devices of the decoder circuit. The pull down devices comprise transistors portion of the base and collector currents of the pull down devices to prevent saturation operation thereof.

Other aspects of the invention relate to the use of the above described anti-saturation clamp to provide improved word decoder systems that exhibit enhanced operating characteristics, and relate to improved methods for enhancing the performance of word decoder systems in general.

The $S_x-T_x$ anti-saturation clamp of the present invention features a performance gain of about 40% for nominal operations.

These and other objects and features of the present invention will be recognized by those skilled in the art upon reviewing the detailed description set forth hereinafter in conjunction with the accompanying Drawing.

DETAILED DESCRIPTION

Figure 1:
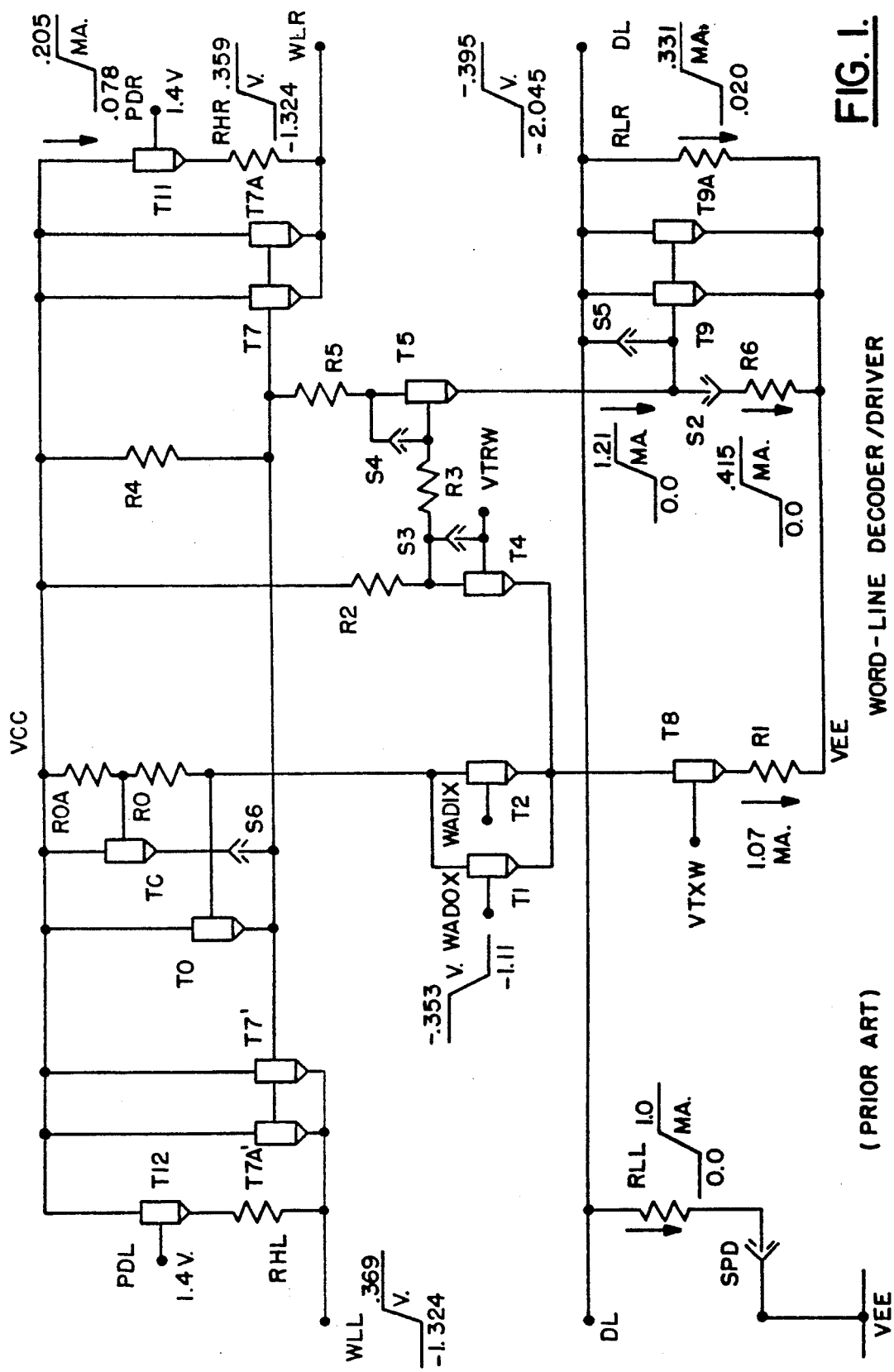
FIG. 1 of the drawings illustrates a word decoder/driver circuit employing a conventional SBD anti-saturation clamp (S5) in the drain line down level control.

FIG. 1 of the Drawing illustrates a known word decoder/driver, commercially available as part of the IBM System 3090. The specific details of operation of this known system, which are well understood by those skilled in the art, will be omitted from this discussions.

The known decoder/driver illustrated in FIG. 1 is particularly adapted for use in connection with Harper/PNP arrays, in which large word line swings are required to guarantee array functionality at extreme conditions. The system has two stages of circuits, the first of which is a regular ECL current switch to handle the initial swing. The second circuit stage employs a saturation inversion device designated as transistor T5 to complete the word line pull up or drain line pull down.

A resistor R4 is employed in the word decoder circuit of FIG. 1 as the pull up device to provide word line selection. When the word line is deselected at the down level, a large current must be pulled down from resistor R4 through transistor T5 while the transistor is in saturation. The saturation capacitance of transistor T5 thus becomes high, thereby delaying the word line upswing, even though an anti-saturation clamp S4 is already employed. The delay in word line upswing becomes particularly pronounced at high temperature operation, and the chip will abruptly lose performance above a temperature of 75 degrees centigrade. The word decoder circuit of FIG. 1 employs a conventional SBD (Schottky Barrier Diode) anti-saturation clamp S5 as the drain line clamp.

For advanced computing applications, performance of the decoder illustrated by FIG. 1 must be improved by 15-30%, while density must be doubled. The illustrated decoder circuit is too slow and a faster decoder must be used to meet the requirements of more advanced technology.

Figure 2:
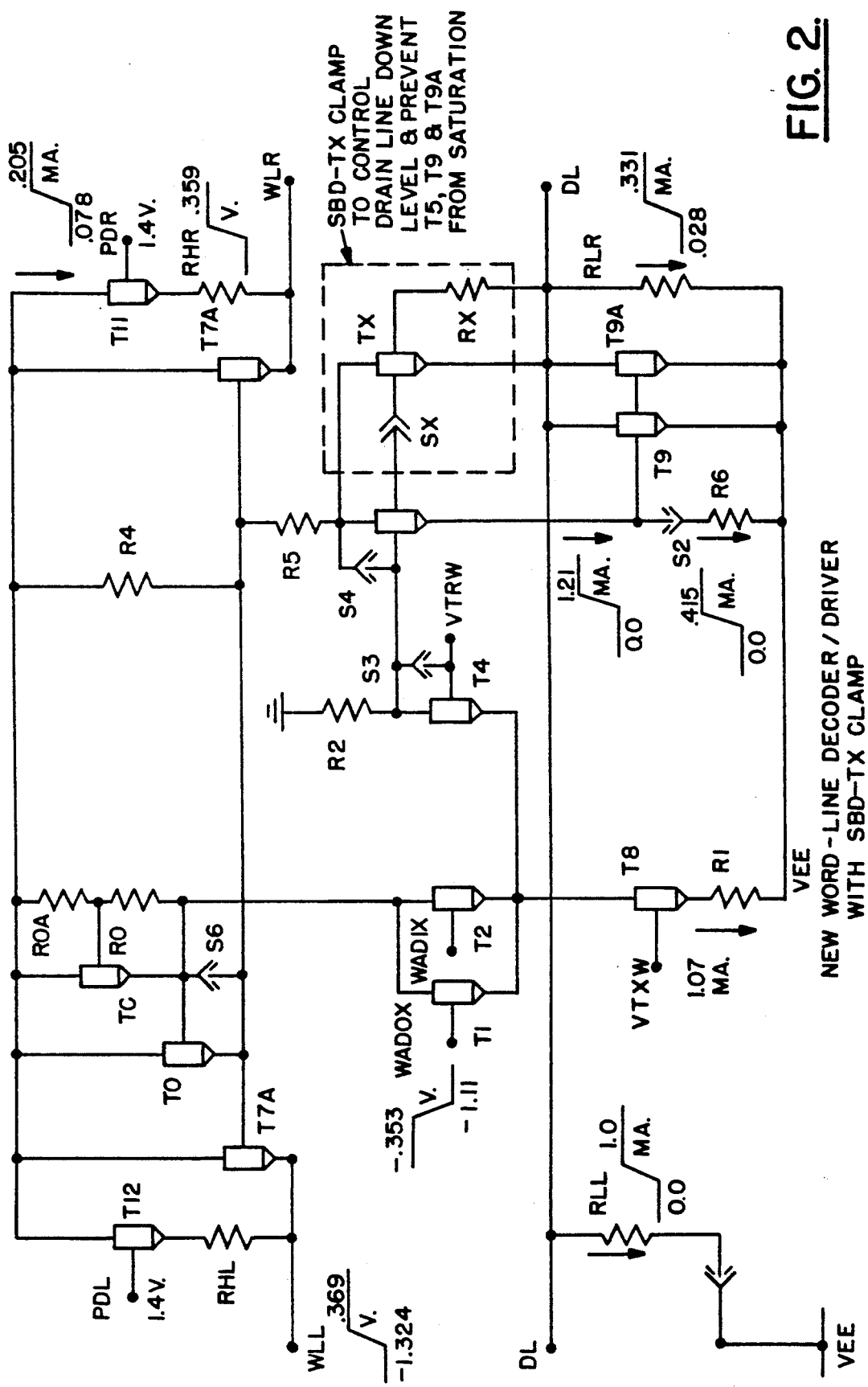
FIG. 2 of the drawings illustrates the word decoder/driver circuit FIG. 1 employing the anti-saturation clamp ($S_x-T_x$) of the present invention.

FIG. 2 of the drawing illustrates the word decoder/driver circuit of FIG. 1 employing an improved anti-saturation clamp in accordance with the present invention.

The conventional SBD drain line clamp S5 illustrated in FIG. 1, has been replaced by a SBD-$T_x$ combination including an SBD clamp $S_x$ in circuit with a transistor $T_x$. The switching transistor T5 of the decoder, which is operable in a saturated state, is in circuit with clamp transistor $T_x$ though the SBD clamp $S_x$, and the clamp $S_X$ is interposed between transistors T5 and $T_x$. The transistor T5 is a switching transistor which forms part of a half current switch for the word decoder circuit.

A sufficient portion of both the base current and the collector current of transistor T5 are diverted through transistor $T_x$ so as to provide a lower $V_{ce}$ and to prevent the switching transistor T5 from saturation operation. By diverting most of the pull down current from the switching transistor T5 to clamp transistor $T_x$, the saturation capacitance of switching transistor T5 becomes negligible even at high temperature operation. Delay in performance of the decoder circuit, otherwise resulting from saturation capacitance, is thus significantly reduced.

SBD clamp $S_x$, which is interposed between switching transistor T5 and clamp transistor $T_x$, replaces the conventional SBD clamp S5 in the known decoder/driver circuit of FIG. 1 as part of the drain line down level control means. The clamp current is amplified by transistor $T_x$, rendering the clamp more efficient and enabling $S_x$ of the SBD-$T_x$ combination to be significantly smaller than the conventional SBD anti-saturation clamp S5 used in the known system of FIG. 1.

Other aspects of the improved anti-saturation clamp of the present invention are also apparent from FIG. 2 of the drawing. In addition to assuring that switching transistor T5 does not operate in saturation, the clamp transistor $T_x$ also controls drain line down level by preventing saturation of pull down devices T9 and T9A which are coupled in circuit to the transistor $T_x$. The pull down devices T9 and T9A comprise transistors which, in the known system of FIG. 1, are clamped by the conventional SBD clamp S5. Saturation of T9 and T9A is avoided in the same manner that saturation of T5 is prevented, i.e., a sufficient portion of the base and collector current of T9 and T9A is diverted through $T_x$.

The circuit of FIG. 2 also illustrates that the R2 supply, which is VCC in the circuit of FIG. 1, has been changed to ground in FIG. 2 to save power.

Figure 3:
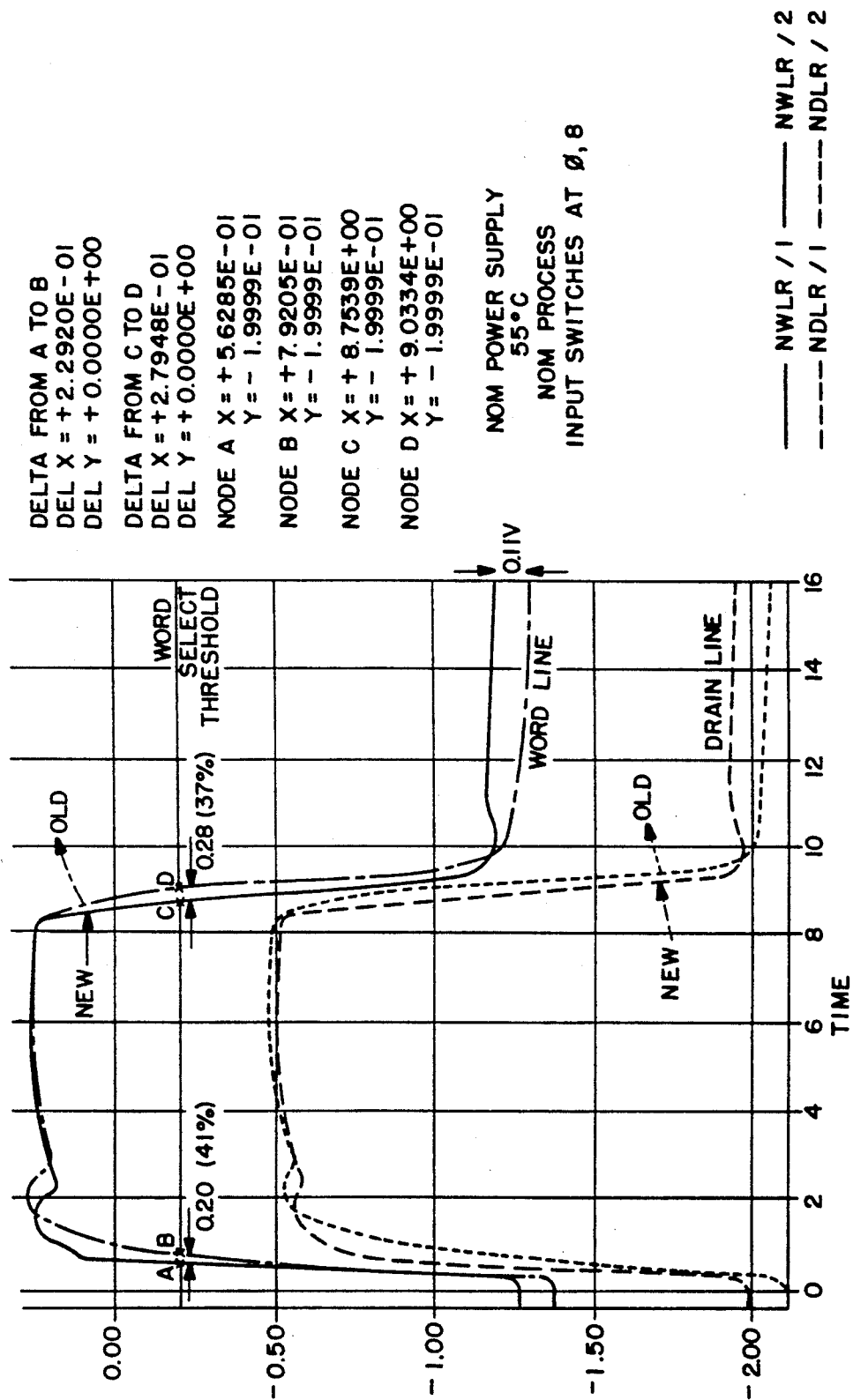
FIG. 3 of the drawing is a chart comparing the performance of the word decoder system of FIG. 1 using a conventional SBD anti-saturation clamp to the performance of the word decoder system of FIG. 2 employing the improved anti-saturation clamp of the present invention.

FIG. 3 of the drawing is a graph comparing performance of the word-line decoder-driver circuit illustrated by FIG. 1 with that of the circuit of FIG. 2 incorporating the improved anti-saturation clamp in accordance with the present invention. The performance gain of the circuit incorporating the new anti-saturation clamp is approximately 40% for nominal operations.

Figure 4:
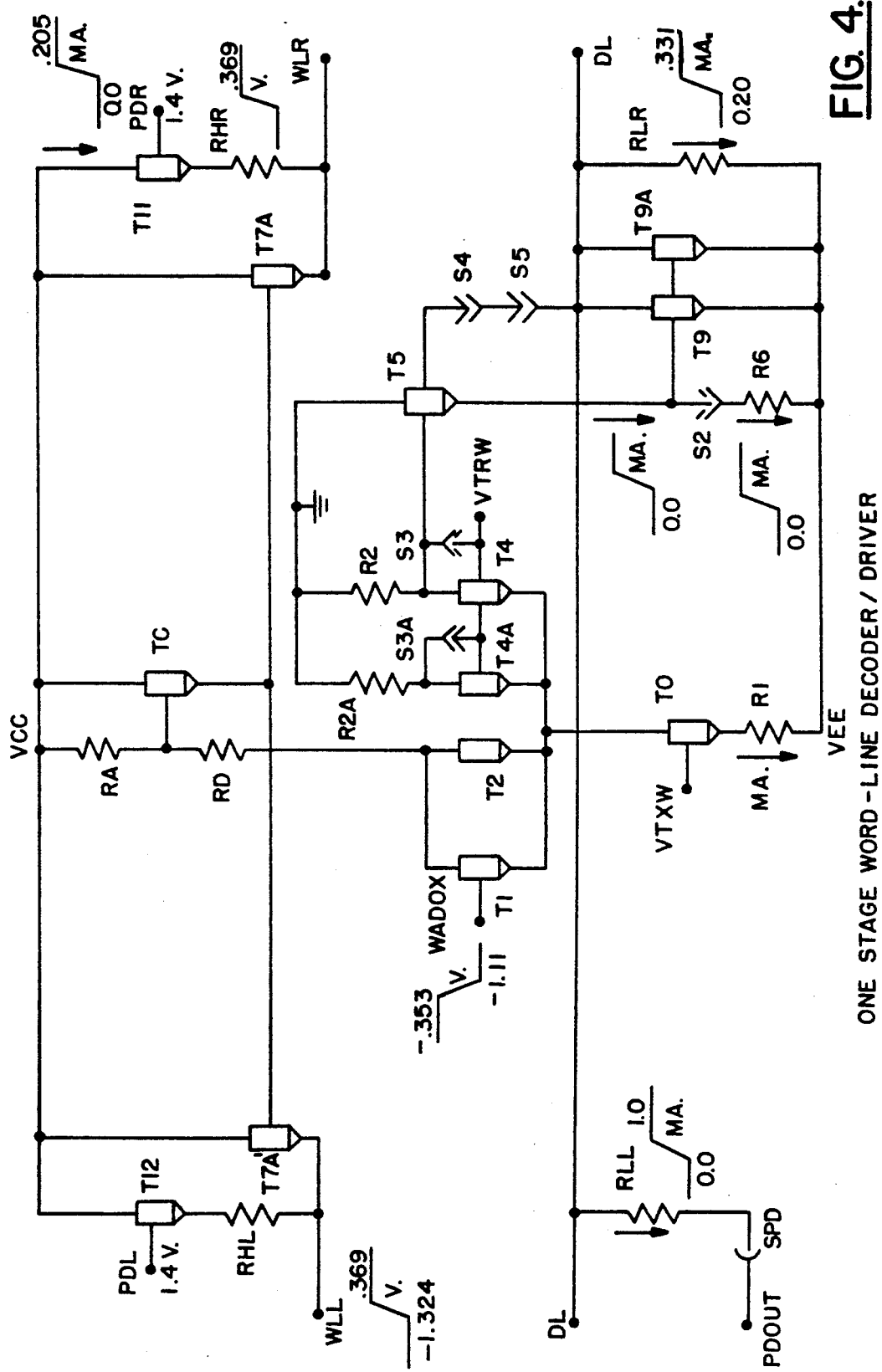
FIG. 4 of the drawing illustrates a typical single stage decoder.

FIG. 4 of the drawing illustrates a one stage word-line decoder-driver circuit. Although better performance gain may be achieved with a one-stage circuit, there are also specific drawbacks. For example, with a power supply span of 3.6 volts, many transistors must operate close to saturation, or the power supply and temperature specifications must be tightened, or the word address receiver swings and the word decoder-driver swings must be reduced. Also the power supply ramp up must be properly sequenced to avoid excessive current surge. None of these alternatives are desirable, and the simplest and most efficient way of obtaining better performance gain will result from use of a two-stage circuit including the improved anti-saturation clamp in accordance with the present invention.

In summary, the anti-saturation clamp of the present invention employs a second transistor $T_x$ in circuit relationship with a switching transistor T5 comprising a half current switch in the decoder circuit, such that a portion of the base and collector current of T5 is diverted through T. This arrangement allows for a lower Vce, and prevents saturation operation of transistor T5. By preventing transistor T5 from operating in saturation, the speed and efficiency of the decoder is improved by eliminating delay in switching which would otherwise result from saturation capacitance of transistor T5.

Other modifications and variations of the invention will become apparent to those skilled in the art. Thus, for example, improved word decoder systems per se and related methods for achieving the improved performance of such systems, are all contemplated aspects of the invention described hereinbefore. Accordingly, the above discussions of the preferred embodiments of the invention has been intended to be an illustrative example only, and not restrictive of the scope of the invention, that scope being defined by the following claims and all equivalents thereto.

What is claimed is:

1. An anti-saturation clamp for a decoder comprising:
   (a) at least a first transistor operable in a saturated state;
   (b) a second transistor coupled to said first transistor for conducting at least a sufficient portion of the base and the collector current of said first transistor through said second transistor through said second transistor to prevent saturation operation of said first transistor; and
   (c) a Schottky Barrier Diode (SBD) coupled between said first and said second transistor.

2. The anti-saturation clamp as set forth in claim 1 wherein said first transistor is part of a half wave switch of said decoder.

3. The anti-saturation clamp as set forth in claim 1 wherein said second transistor amplifies the electrical current flowing through said clamp.

4. The anti-saturation clamp as set forth in claim 1 wherein said clamp forms part of a drain line down level control of said decoder.

5. The anti-saturation clamp as set forth in claim 1 wherein said second transistor is further coupled to at least one pull down device for preventing saturation of said pull down device.

6. The anti-saturation clamp as set forth in claim 5 wherein said pull down device further comprises a third transistor.

7. In a two stage decoder circuit having a second circuit state including a saturation inversion device comprising a first transistor, and an anti-saturation clamp, the improvement comprising:
   said anti-saturation clamp comprising a second transistor coupled to said first transistor for conducting at least a sufficient of the base current and the collector current of said first transistor through said second transistor to prevent saturation operation of said first transistor; and
   a Schottky Barrier Diode (SBD) coupled between said first transistor and said second transistor.

8. The decoder circuit as set forth in claim 7 wherein said first transistor is part of a half wave switch of the decoder circuit.

9. The decoder circuit as set forth in claim 7 wherein said second transistor amplifies the electrical current flowing through said clamp.

10. The decoder as set forth in claim 8 wherein said second transistor of said anti-saturation clamp forms part of a drain line down level control means of said decoder circuit.

11. The decoder as set forth in claim 7 wherein said decoder circuit further includes at least one pull down device, said pull down device being coupled to said second transistor of said anti-saturation clamp.

12. The decoder as set forth in claim 11 wherein said pull down device further comprises a third transistor.

13. The decoder as set forth in claim 12 wherein said second transistor of said anti-saturation clamp conducts a sufficient portion of the base and the collector current of said third transistor to prevent saturation operation of said third transistor.

14. A method for improving the performance gain of a two-stage decoder circuit having a second circuit stage including saturation inversion by a first transistor, the steps of said method comprising:
   (a) coupling an anti-saturation clamp including a second transistor coupled to said first transistor;
   (b) diverting a sufficient portion of the collector current and the base current of said first transistor through said second transistor for preventing saturation operation of said first transistor; and
   (c) interposing a Schottky Barrier Diode (SBD) coupled between said first and said second transistors.

15. The method of claim 14 further comprising the step of amplifying the current flow through said SBD by said second transistor.

16. The method of claim 14 further comprising the step of coupling a pull down device comprising a third transistor coupled to said second transistor.

17. The method of claim 16 further comprising the step of diverting a sufficient portion of the base and the collector current of said third transistor through said second transistor to prevent saturation operation of said third transistor.

* * * * *